United States Patent
Harada et al.

(10) Patent No.: US 8,502,236 B2
(45) Date of Patent: Aug. 6, 2013

(54) INSULATED GATE FIELD EFFECT TRANSISTOR

(75) Inventors: Shin Harada, Osaka (JP); Keiji Wada, Osaka (JP); Toru Hiyoshi, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 198 days.

(21) Appl. No.: 13/122,377

(22) PCT Filed: Mar. 23, 2010

(86) PCT No.: PCT/JP2010/054951
§ 371 (c)(1),
(2), (4) Date: Apr. 1, 2011

(87) PCT Pub. No.: WO2010/116887
PCT Pub. Date: Oct. 14, 2010

(65) Prior Publication Data
US 2011/0180814 A1 Jul. 28, 2011

(30) Foreign Application Priority Data
Apr. 10, 2009 (JP) .................................. 2009-095482

(51) Int. Cl.
*H01L 29/15* (2006.01)

(52) U.S. Cl.
USPC ............. 257/77; 257/173; 257/362; 257/410; 257/586; 257/592; 257/E29.104; 257/E29.197; 257/E29.2

(58) Field of Classification Search
USPC .................. 257/77, 173, 362, 410, 586, 592, 257/E29.104, E29.197, E29.2
See application file for complete search history.

(56) References Cited

U.S. PATENT DOCUMENTS

| 6,734,461 B1 | 5/2004 | Shiomi et al. |
| 7,671,409 B2 | 3/2010 | Kitabatake et al. |
| 2004/0211980 A1 | 10/2004 | Ryu |

(Continued)

FOREIGN PATENT DOCUMENTS

| CN | 1802752 A | 7/2006 |
| EP | 1 689 000 A1 | 8/2006 |

(Continued)

OTHER PUBLICATIONS

Office Action in Chinese Patent Application No. 201080002821.9, dated Jan. 7, 2013.

(Continued)

*Primary Examiner* — Tu-Tu Ho
(74) *Attorney, Agent, or Firm* — Venable LLP; Michael A. Sartori; Tamatane J. Aga

(57) ABSTRACT

A MOSFET, which is capable of reducing on resistance by reducing channel mobility even when a gate voltage is high, includes: an n type substrate made of SiC and having a main surface with an off angle of 50°-65° relative to a {0001} plane; an n type reverse breakdown voltage holding layer made of SiC and formed on the main surface of the substrate; a p type well region formed in the reverse breakdown voltage holding layer distant away from a first main surface thereof; a gate oxide film formed on the well region; an n type contact region disposed between the well region and the gate oxide film; a channel region connecting the n type contact region and the reverse breakdown voltage holding layer; and a gate electrode disposed on the gate oxide film. In a region including an interface between the channel region and the gate oxide film, a high-concentration nitrogen region is formed.

5 Claims, 7 Drawing Sheets

U.S. PATENT DOCUMENTS

| | | |
|---|---|---|
| 2006/0220026 A1 | 10/2006 | Uchida et al. |
| 2007/0176230 A1 | 8/2007 | Uchida et al. |
| 2008/0265260 A1 | 10/2008 | Kitabatake et al. |

FOREIGN PATENT DOCUMENTS

| | | |
|---|---|---|
| EP | 1 775 774 A1 | 4/2007 |
| JP | 10-308510 A | 11/1998 |
| JP | 11-330464 A | 11/1999 |
| JP | 2000-188399 A | 7/2000 |
| JP | 2001-144288 A | 5/2001 |
| JP | 2002-261041 A | 9/2002 |
| JP | 2002-261275 A | 9/2002 |
| JP | 2005166930 A | 6/2005 |
| JP | 2005-183943 A | 7/2005 |
| JP | 3854508 B2 | 12/2006 |
| JP | 4064436 B2 | 3/2008 |
| WO | WO-02/29874 A2 | 4/2002 |

OTHER PUBLICATIONS

Matsunami et al., "Hetero-Interface Properties of $SiO_2$ /4H-SiC on Various Crystal Orientations," IEICE Trans. Electron., vol. E86-C, No. 10, pp. 1943-1948 (Oct. 2003).

Extended European Search Report in European Patent Application No. 10761587.4 dated Apr. 16, 2013.

INSULATED GATE FIELD EFFECT TRANSISTOR

TECHNICAL FIELD

The present invention relates to an insulated gate field effect transistor, more particularly, an insulated gate field effect transistor capable of improving channel mobility.

BACKGROUND ART

In recent years, in order to achieve high reverse breakdown voltage and low loss in semiconductor devices as well as utilization thereof in a high temperature environment, silicon carbide (SiC) has begun to be adopted as a material for the semiconductor devices. Silicon carbide is a wide band gap semiconductor having a larger band gap than that of silicon (Si), which has been widely used as a material for semiconductor devices conventionally. Hence, the adoption of silicon carbide as the material for semiconductor devices will achieve high reverse breakdown voltage, reduced on resistance, and the like in the semiconductor devices. Further, when such semiconductor devices formed using silicon carbide as their material are utilized in a high temperature environment, the semiconductor devices are less deteriorated in properties as compared with semiconductor devices formed using silicon as their material, advantageously.

However, properties required in semiconductor devices are high in recent years. For example, even when SiC is employed as a material of a MOSFET (Metal Oxide Semiconductor Field Effect Transistor), further reduction of on resistance therein is still required. For the reduction of on resistance, it is effective to improve channel mobility.

Proposed is a MOSFET structure employing an accumulation mode as an operation mode in the MOSFET. This allegedly improves the channel mobility, thereby reducing on resistance (for example, see Japanese Patent Laying-Open No. 10-308510 (Patent Document 1) and Japanese Patent Laying-Open No. 11-330464 (Patent Document 2)).

PRIOR ART DOCUMENTS

Patent Documents

Patent Document 1: Japanese Patent Laying-Open No. 10-308510
Patent Document 2: Japanese Patent Laying-Open No. 11-330464

SUMMARY OF THE INVENTION

Problems to be Solved by the Invention

However, requirements for properties of MOSFETs are still increasing in recent years. In consideration of the requirements, it cannot be said that conventional MOSFETs, including the MOSFETs disclosed in Patent Documents 1 and 2, have a sufficiently high channel mobility. Accordingly, on resistance therein is not sufficiently reduced, disadvantageously. More specifically, when a gate voltage is low, each of the accumulation type MOSFETs disclosed in Patent Documents 1 and 2 has a large channel mobility. However, as the gate voltage becomes higher, an influence of an interface between the SiC, which forms a channel, and a gate oxide film, i.e., $SiO_2$ is increased. This results in a mobility as large as those of conventional inversion type MOSFETs (see S. Harada et al., "Improved Channel Mobility in Normally-Off 4H-SiC MOSFETs with Buried Channel Structure", Materials Science Forum, 2002, Vols. 389-393, p. 1069-1072). As such, improvement of the channel mobility is insufficient when the gate voltage is high.

In view of the foregoing problem, an object of the present invention is to provide a MOSFET capable of reducing on resistance by improving channel mobility, even when a gate voltage is high.

Means for Solving the Problems

A MOSFET, which is an insulated gate field effect transistor according to the present invention, includes a substrate, a reverse breakdown voltage holding layer, a well region, an oxide film, a first conductive type contact region, a channel region, and an electrode. The substrate is made of silicon carbide (SiC), has a main surface with an off angle of not less than 50° and not more than 65° relative to a {0001} plane, and is of the first conductive type. The reverse breakdown voltage holding layer is made of SiC, is formed on the main surface of the substrate, and is of first conductive type. The well region is formed in the reverse breakdown voltage holding layer distant away from its first main surface, which is a main surface adjacent to the substrate, and is of second conductive type different from the first conductive type.

The oxide film is formed on the well region, and is made of oxide. The first conductive type contact region is disposed between the well region and the oxide film, and is of the first conductive type by including an impurity of the first conductive type at a concentration higher than that of the reverse breakdown voltage holding layer. The channel region is disposed between the well region and the oxide film in contact with the well region and the oxide film, connects the first conductive type contact region and the reverse breakdown voltage holding layer to each other, and is of the first conductive type by including an impurity of the first conductive type at a concentration lower than that of the first conductive type contact region. The electrode is disposed on the oxide film. In a region including an interface between the channel region and the oxide film, a high-concentration nitrogen region is formed to have a nitrogen concentration higher than those of the channel region and the oxide film.

The present inventor has closely studied a method to improve channel mobility of an accumulation type MOSFET when a gate voltage is high. As a result, the present inventor has found the following and arrived at the present invention.

Specifically, a SiC substrate employed in an accumulation type MOSFET adopting SiC as its material generally has a main surface with an off angle of approximately 8° relative to a plane orientation of {0001}. On the main surface, a reverse breakdown voltage holding layer, a well region, a channel region, an oxide film, an electrode, and the like are formed to obtain the accumulation type MOSFET. However, in the accumulation type MOSFET having such a structure, because the substrate has the main surface with the off angle of approximately 8° relative to the plane orientation of {0001}, a multiplicity of interface states are formed in the vicinity of an interface between the channel region and the oxide film, which prevents traveling of electrons. Under a low gate voltage, an influence of the interface states is small, so high channel mobility can be attained. However, under a high gate voltage, the influence of the interface states causes decreased channel mobility.

To address this, the MOSFET of the present invention employs the SiC substrate having the main surface with the off angle of not less than 50° and not more than 65° relative to the plane orientation of {0001}, thereby reducing formation of the interface states to improve channel mobility under a high gate voltage.

Further, it has been found that the high-concentration nitrogen region formed in the region including the interface between the channel region and the oxide film results in improved channel mobility under a high gate voltage. Accordingly, in the MOSFET of the present invention, the channel mobility is further improved.

As described above, according to the MOSFET of the present invention, there can be provided a MOSFET capable of reducing the on resistance by improving the channel mobility even when the gate voltage is high.

Here, the lower limit of the off angle is set at 50° based on the following facts: as a result of inspecting a relation between the off angle and the channel mobility of an inversion type MOSFET that determines the channel mobility of an accumulation type MOSFET under a high gate voltage, it was observed that as the off angle is increased in the course of a (01-14) plane in which the off angle is 43.3° to a (01-13) plane in which the off angle is 51.5°, the channel mobility is significantly increased, and there is no natural plane in the range of the off angle between the (01-14) plane and the (01-13) plane. Further, the upper limit of the off angle is set at 65° based on the following facts: it was observed that the carrier mobility is significantly decreased as the off angle is increased in the course of a (01-12) plane in which the off angle is 62.1° to a (01-10) plane in which the off angle is 90°, and there is no natural plane in the range of the off angle between the (01-12) plane and the (01-10) plane.

In the above-described MOSFET, the nitrogen concentration in a region distant away by 10 nm or shorter from the interface between the channel region and the oxide film has a maximum value of not less than $1 \times 10^{21}$ cm$^{-3}$.

As a result of review by the present inventor, for improvement of channel mobility in an accumulation type MOSFET under a high gate voltage, it is necessary to improve channel mobility of an inversion type MOSFET. In order to improve the channel mobility of the inversion type MOSFET, it was found that the maximum value of the nitrogen concentration is important in the region distant away by 10 nm or shorter from the interface between the well region and the oxide film. By setting the maximum value of the nitrogen concentration in the region at $1 \times 10^{21}$ cm$^{-3}$ or greater, it was found that the channel mobility is significantly improved. Hence, with the above-described configuration, the channel mobility can be further improved.

In the MOSFET, the main surface of the substrate may have an off orientation falling within a range of ±5° or smaller relative to a <11-20> direction.

The <11-20> direction is a representative off orientation in the SiC substrate. Variation of the off orientation, which is caused by variation, etc., in a slicing process in a step of manufacturing the substrate, is set to be ±5°, thereby facilitating formation of an epitaxial layer on the SiC substrate, and the like. In this way, the MOSFET can be manufactured readily.

In the MOSFET, the main surface of the substrate may have an off orientation falling within a range of ±5° or smaller relative to the <01-10> direction.

As with the <11-20> direction described above, the <01-10> direction is a representative off orientation in the SiC substrate. Variation of the off orientation, which is caused by variation, etc., in the slicing process in the step of manufacturing the substrate, is set to be ±5°, thereby facilitating formation of an epitaxial layer on the SiC substrate, and the like. In this way, the MOSFET can be manufactured readily.

In the MOSFET, the main surface of the substrate can have an off angle of not less than −3° and not more than +5° relative to a plane orientation of {03-38}.

In this way, the channel mobility can be further improved. Here, the off angle is thus set at not less than −3° and not more than +5° relative to the plane orientation of {03-38} because particularly high channel mobility was obtained in this range as a result of inspecting the relation between the channel mobility and the off angle.

Here, the state in which "the off angle is not less than −3° and not more than +5° relative to the plane orientation of {03-38}" refers to a state in which the orthogonal projection of a normal line of the main surface to a flat plane defined by the <0001> direction and the <01-10> direction serving as a reference for the off orientation forms an angle of not less than −3° and not more than +5° relative to a normal line of the {03-38} plane. The sign of a positive value corresponds to a case where the orthogonal projection approaches in parallel with the <01-10> direction whereas the sign of a negative value corresponds to a case where the orthogonal projection approaches in parallel with the <0001> direction.

It should be noted that the plane orientation of the main surface thereof is more preferably substantially {03-38} and the plane orientation of the main surface thereof is further preferably {03-38}. Here, the expression "the plane orientation of the main surface is substantially {03-38}" indicates that the plane orientation of the main surface of the substrate is included in a range of the off angle in which the plane orientation of the substrate can be regarded as substantially {03-38} in consideration of precision of processing the substrate and the like. The range of the off angle in this case is a range in which the off angle is ±2° relative to {03-38}, for example. In this way, the above-described channel mobility can be improved further.

In the MOSFET, the main surface of the substrate has an off angle of not less than −3° and not more than +5° relative to a (0-33-8) plane in the <01-10> direction.

In particular, a structure is employed in which semiconductor layers and an insulating film are formed on a surface close to the (0-33-8) plane, which is a plane close to the C (carbon) plane in the {03-38} plane. In this way, the carrier mobility is improved significantly.

Here, in the present application, the (0001) plane of single-crystal silicon carbide of hexagonal crystal is defined as the silicon plane whereas the (000-1) plane is defined as the carbon plane. Meanwhile, the "off angle relative to the (0-33-8) plane in the <01-10> direction" refers to an angle formed by the orthogonal projection of a normal line of the main surface to a flat plane defined by the <000-1> direction and the <01-10> direction serving as a reference for the off orientation, and a normal line of the (0-33-8) plane. The sign of a positive value corresponds to a case where the orthogonal projection approaches in parallel with the <01-10> direction, whereas the sign of a negative value corresponds to a case where the orthogonal projection approaches in parallel with the <000-1> direction. Further, the expression "the main surface having an off angle of not less than −3° and not more than +5° relative to the (0-33-8) plane in the <01-10> direction" indicates that the main surface corresponds to a plane, at the carbon plane side, which satisfies the above-described conditions in the silicon carbide crystal. It should be noted that in the present application, the (0-33-8) plane includes an equivalent plane, at the carbon plane side, which is expressed in a different manner due to determination of an axis for defining a crystal plane, and does not include a plane at the silicon plane side.

Effects of the Invention

As apparent from the description above, according to the MOSFET of the present invention, there can be provided a MOSFET capable of reducing on resistance by improving channel mobility even when the gate voltage is high.

MODES FOR CARRYING OUT THE INVENTION

Figure 1:
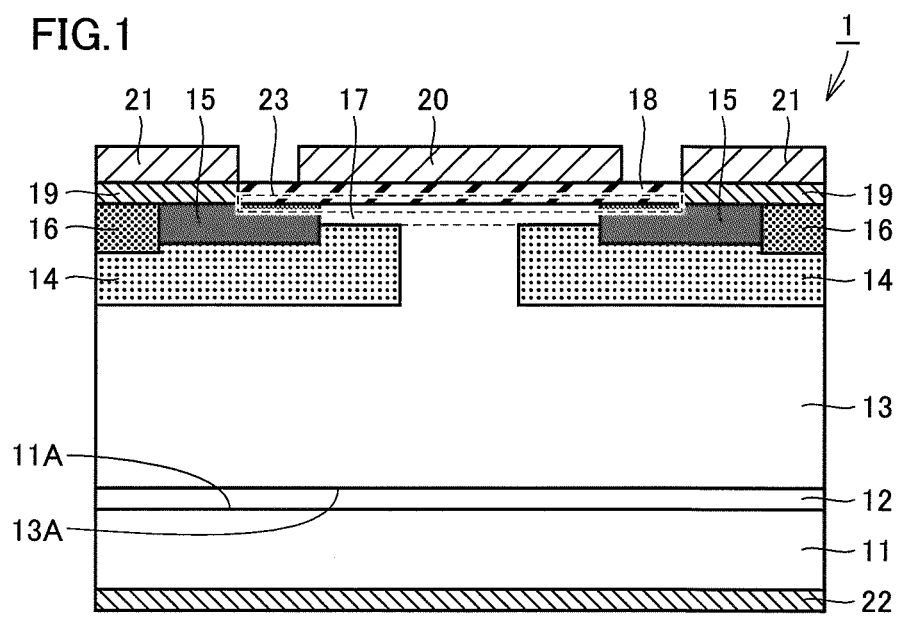
FIG. 1 is a schematic cross sectional view showing a structure of a MOSFET.

The following describes an embodiment of the present invention with reference to figures. It should be noted that in the below-mentioned figures, the same or corresponding portions are given the same reference characters and are not described repeatedly.

First, a structure of a MOSFET in the one embodiment of the present invention will be described. Referring to FIG. 1, MOSFET 1 in the present embodiment includes a substrate 11, a buffer layer 12, a reverse breakdown voltage holding layer 13, well regions 14, n type contact regions 15, p type contact regions 16, a channel region 17, and a gate oxide film 18.

Substrate 11 is formed of hexagonal SiC, such as 4H-SiC, and has a main surface 11A having an off angle of not less than 50° and not more than 65° relative to a plane orientation of {0001}, for example, having a plane orientation of (03-38). In addition, substrate 11 includes an n type impurity, thus having n type (first conductive type) conductivity. Further, substrate 11 has a resistivity of approximately 0.02 Ωcm, for example.

Buffer layer 12 is a SiC layer formed on main surface 11A of substrate 11 through epitaxial growth. Buffer layer 12 has a thickness of approximately 0.5 μm. Buffer layer 12 contains an n type impurity at a concentration of approximately $5 \times 10^{17}$ cm$^{-3}$, and therefore has n type (first conductive type) conductivity.

Reverse breakdown voltage holding layer 13 is formed of SiC, and is formed above main surface 11A of substrate 11 with buffer layer 12 interposed therebetween. Reverse breakdown voltage holding layer 13 includes an n type impurity at a concentration of approximately $5 \times 10^{15}$ cm$^3$, and therefore has n type conductivity. Further, reverse breakdown voltage holding layer 13 has a thickness of, for example, approximately 10 μm.

The pair of well regions 14 are formed in reverse breakdown voltage holding layer 13 so as to be distant away from its first main surface 13A, which is a main surface adjacent to substrate 11. Each of well regions 14 includes a p type impurity and therefore has p type (second conductive type) conductivity.

Gate oxide film 18 is formed on well regions 14 (reverse breakdown voltage holding layer 13), and is formed of silicon dioxide (SiO$_2$), which is an oxide. Gate oxide film 18 has a thickness of approximately 40 nm, for example.

The pair of n type contact regions 15, each of which serves as a first conductive type contact region, are disposed between each of well regions 14 and gate oxide film 18 in contact with well regions 14 and gate oxide film 18. Each of n type contact regions 15 includes an n type impurity having a concentration higher than that in reverse breakdown voltage holding layer 13, and therefore has n type conductivity. When viewed in a planar view, n type contact regions 15 are disposed to be included in well regions 14 respectively. In other words, when viewed from above (from the side of gate oxide film 18) perpendicularly to main surface 11A of substrate 11, n type contact regions 15 are respectively included in well regions 14.

P type contact regions 16, each of which serves as a second conductive type contact region, are disposed adjacent to n type contact regions 15. Each of p type contact regions 16 has a p type impurity having a concentration higher than those in well regions 14, and therefore has p type conductivity. More specifically, each of the pair of p type contact regions 16 is disposed adjacent to one side of a corresponding one of the pair of n type contact regions 15. When viewed from one n type contact region 15, the one side thereof is opposite to the other n type contact region 15. Further, p type contact regions 16 are disposed between well regions 14 and ohmic contact electrodes 19 (described later) in contact with well regions 14 and ohmic contact electrodes 19.

Channel region 17 is disposed between each of well regions 14 and gate oxide film 18 in contact with well regions 14 and gate oxide film 18, so as to connect n type contact regions 15 and reverse breakdown voltage holding layer 13 to each other. Further, channel region 17 includes an n type impurity with a concentration lower than those in n type contact regions 15, and therefore has n type conductivity. Now, channel region 17 is described from a different point of view. That is, channel region 17 is disposed to extend along gate oxide film 18 from each of n type contact regions 15 in a direction opposite to each of p type contact regions 16 adjacent to n type contact regions 15, so as to connect n type contact regions 15 and reverse breakdown voltage holding layer 13 to each other.

Further, MOSFET 1 in the present embodiment includes a gate electrode 20, ohmic contact electrodes 19, source electrodes 21, and a drain electrode 22.

Gate electrode 20 is disposed on and in contact with gate oxide film 18, and extends from regions on n type contact regions 15, in the direction opposite to each of p type contact regions 16 when viewed from n type contact regions 15. Accordingly, gate electrode 20 faces channel region 17 with gate oxide film 18 interposed therebetween. Gate electrode 20 is formed of a conductor such as Al (aluminum) or polysilicon.

Each of ohmic contact electrodes 19 is disposed on each of n type contact regions 15 and each of p type contact regions 16 so as to extend from a region in which it makes contact with a corresponding n type contact region 15 to a region in which it makes contact with a corresponding p type contact region 16. Further, ohmic contact electrode 19 is formed of a conductor at least partially silicided to secure ohmic contact with n type contact regions 15, such as Ni (nickel).

Source electrodes 21 are disposed on and in contact with ohmic contact electrodes 19, and are formed of a conductor such as Al. Further, drain electrode 22 is formed on an opposite main surface of substrate 11 to the main surface thereof on which reverse breakdown voltage holding layer 13 is formed. Drain electrode 22 is formed of a conductor at least partially silicided to secure ohmic contact with substrate 11, such as Ni (nickel).

Further, in a region including an interface between channel region 17 and gate oxide film 18, there is formed a high-concentration nitrogen region 23 having a nitrogen concentration higher than those in channel region 17 and gate oxide film 18.

The following describes operations of MOSFET 1 in the present embodiment. Referring to FIG. 1, when a voltage applied to gate electrode 20 is smaller than a threshold value, a depletion layer is formed in channel region 17 sandwiched between each of well regions 14 and gate electrode 20. Accordingly, n type contact regions 15 and reverse breakdown voltage holding layer 13 are not electrically connected to one another. Hence, MOSFET 1 is in an off state. On the other hand, when the voltage applied to gate electrode 20 becomes equal to or larger than the threshold value, the depletion layer in channel region 17 below gate oxide film 18 is reduced to electrically connect n type contact regions 15 and reverse breakdown voltage holding layer 13 to one another. This brings MOSFET 1 into an on state to allow a current to flow between each of source electrodes 21 and drain electrode 22.

Here, MOSFET 1 in the present embodiment employs substrate 11 having main surface 11A with an off angle of not less than 50° and not more than 65° relative to the plane orientation of {0001}. Further, buffer layer 12, reverse breakdown voltage holding layer 13, and channel region 17 are formed on and above main surface 11A through epitaxial growth. Hence, interface states are less formed in the vicinity of the interface between gate oxide film 18 and channel region 17, thereby improving channel mobility under a high gate voltage. It should be noted that by setting the plane orientation of main surface 11A to (0-33-8), the channel mobility can be improved more.

Further, high-concentration nitrogen region 23 formed in the region including the interface between channel region 17 and gate oxide film 18 further improves the channel mobility under high gate voltage. This is considered to be attained due to the following reasons. That is, in the case where gate oxide film 18 is formed by means of thermal oxidation or the like, a multiplicity of interface states are formed in the vicinity of the interface between gate oxide film 18 and channel region 17. If nothing is done, the channel mobility in the vicinity of the interface will be drastically decreased as compared with a theoretical value under a high gate voltage, disadvantageously. To address this, nitrogen is introduced into the region including the interface between gate oxide film 18 and channel region 17 as described above, so as to reduce the influence of the interface states.

As described above, MOSFET 1 in the present embodiment is a MOSFET in which the channel mobility is improved to reduce the on resistance, even when the gate voltage is high.

Here, in the MOSFET in the present embodiment, it is desirable that the maximum value of the nitrogen concentration is not less than $1 \times 10^{21}$ cm$^{-3}$ in a region distant away by 10 nm or shorter from the interface between channel region 17 and gate oxide film 18. In this way, the channel mobility can be further improved.

It should be noted that in the embodiment, there may be employed a substrate having a main surface with an off orientation falling within a range of ±5° or smaller relative to the <11-20> direction, instead of substrate 11 having the main surface with the plane orientation of (03-38). This facilitates formation of an epitaxial layer on the SiC substrate, thus facilitating manufacturing of the MOSFET.

In the embodiment, main surface 11A of substrate 11 may have an off orientation falling within a range of ±5° or smaller relative to the <01-10> direction. This facilitates formation of an epitaxial layer on the SiC substrate, thus facilitating manufacturing of the MOSFET. Further, the channel mobility can be improved more by setting the plane orientation of main surface 11A of substrate 11 such that the off angle is not less than −3° and not more than +5° relative to the plane orientation of {03-38}. Furthermore, it is most preferable that the plane orientation of main surface 11A of substrate 11 be the plane orientation of {03-38}.

Figure 2:
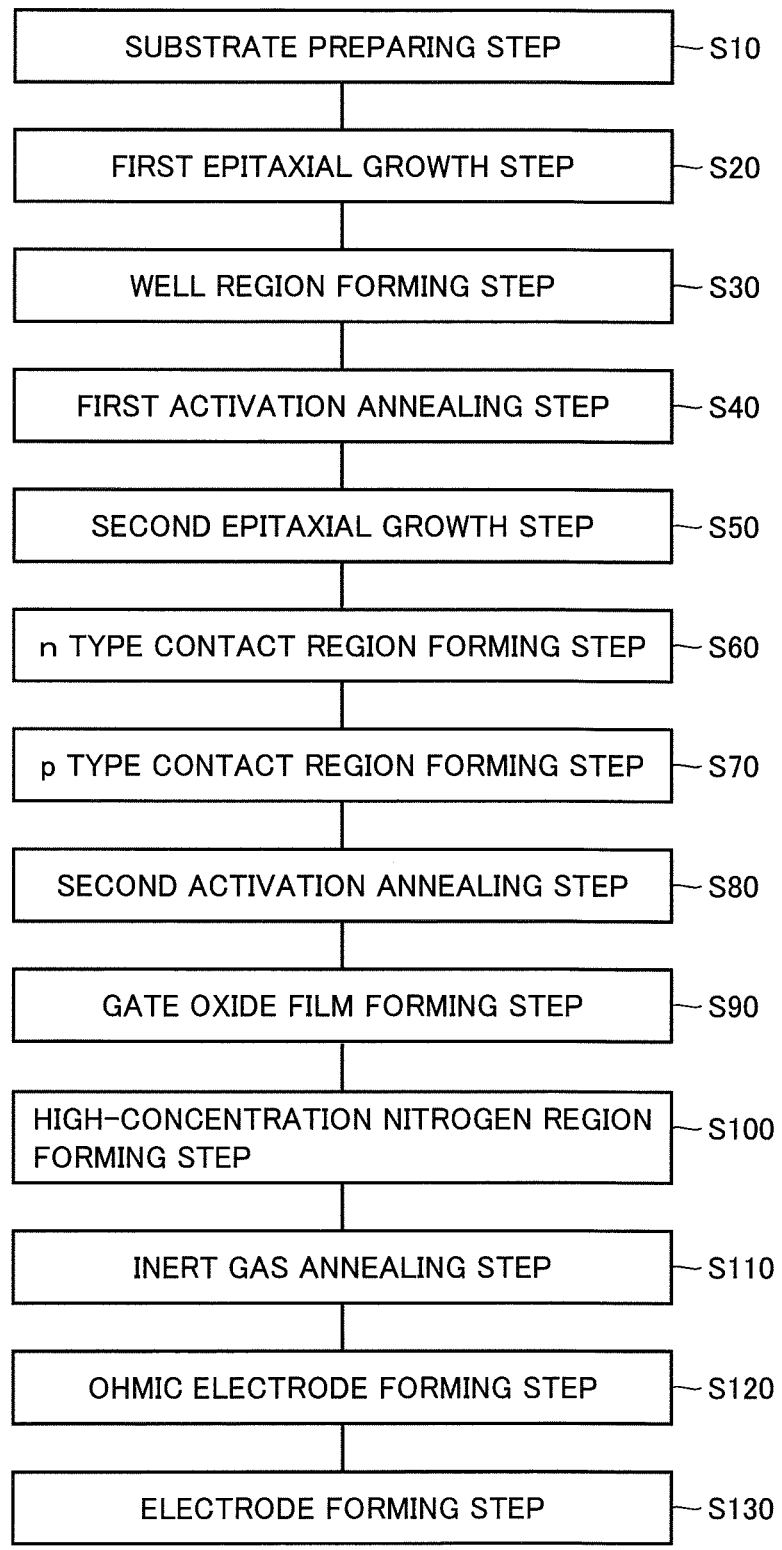
FIG. 2 is a flowchart schematically showing a method for manufacturing the MOSFET.
Figure 3:
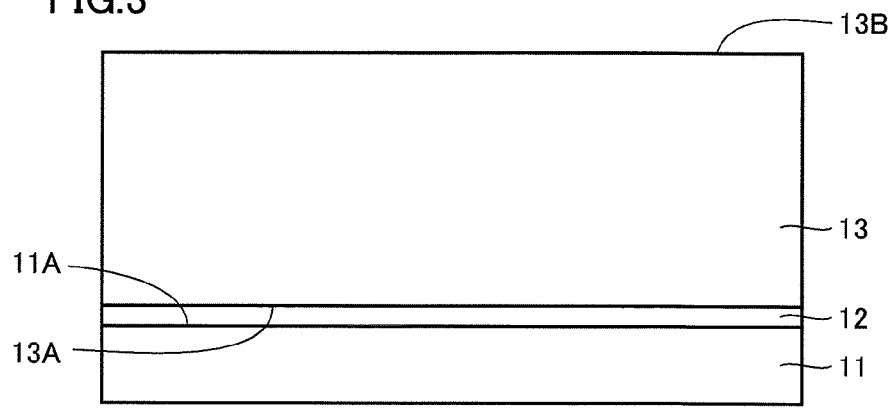
FIG. 3 is a schematic cross sectional view for illustrating the method for manufacturing the MOSFET.
Figure 4:
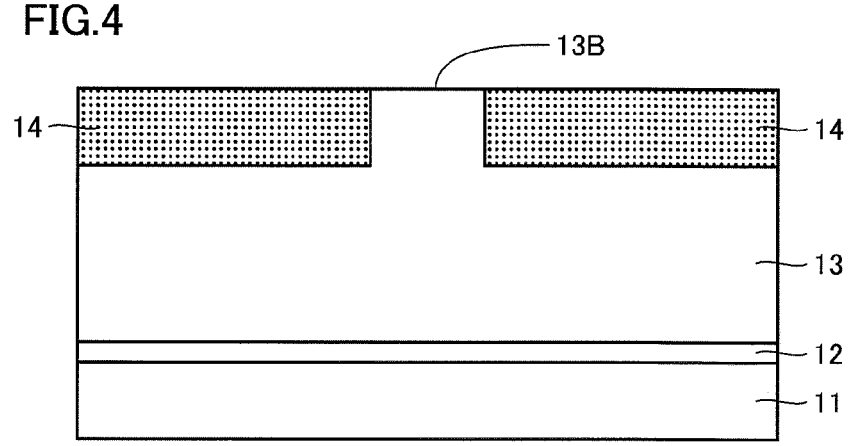
FIG. 4 is a schematic cross sectional view for illustrating the method for manufacturing the MOSFET.
Figure 5:
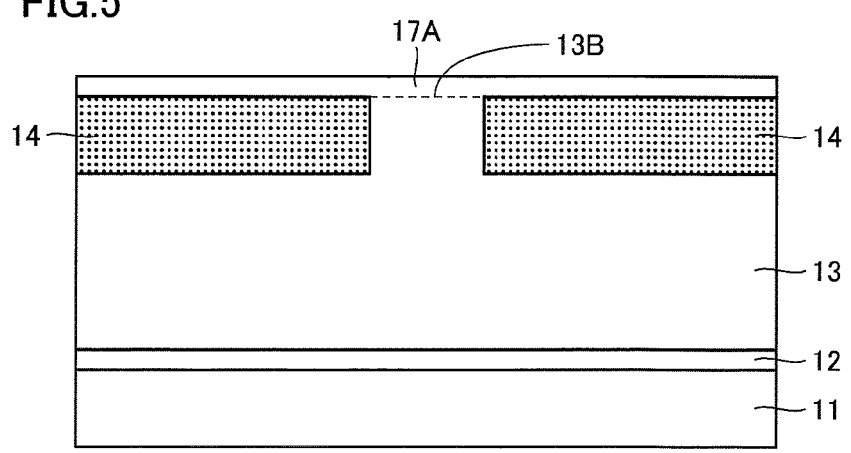
FIG. 5 is a schematic cross sectional view for illustrating the method for manufacturing the MOSFET.
Figure 6:
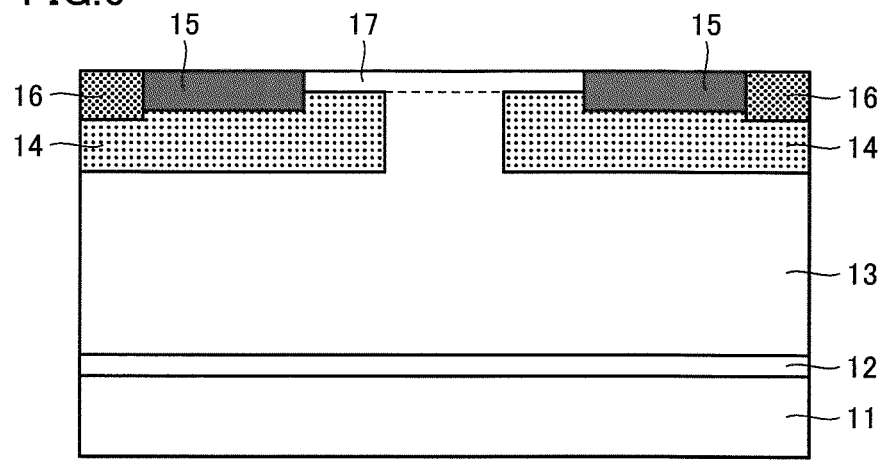
FIG. 6 is a schematic cross sectional view for illustrating the method for manufacturing the MOSFET.
Figure 7:
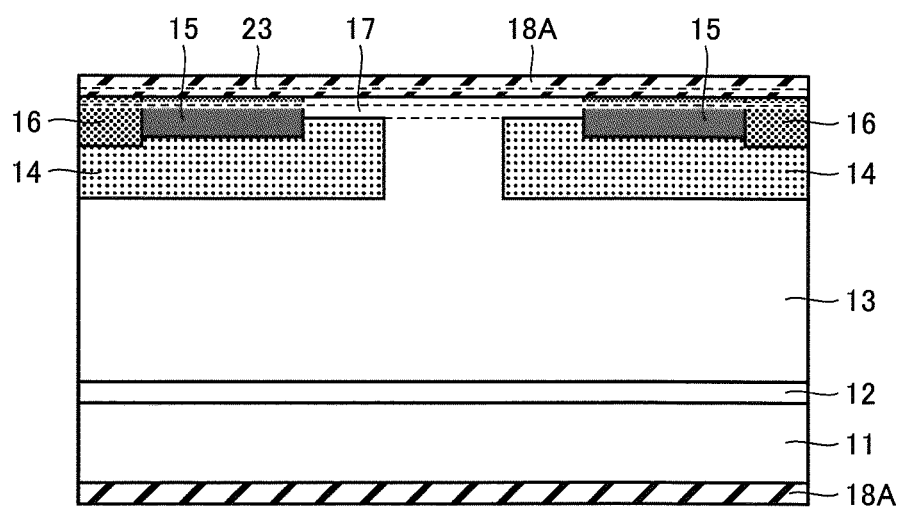
FIG. 7 is a schematic cross sectional view for illustrating the method for manufacturing the MOSFET.
Figure 8:
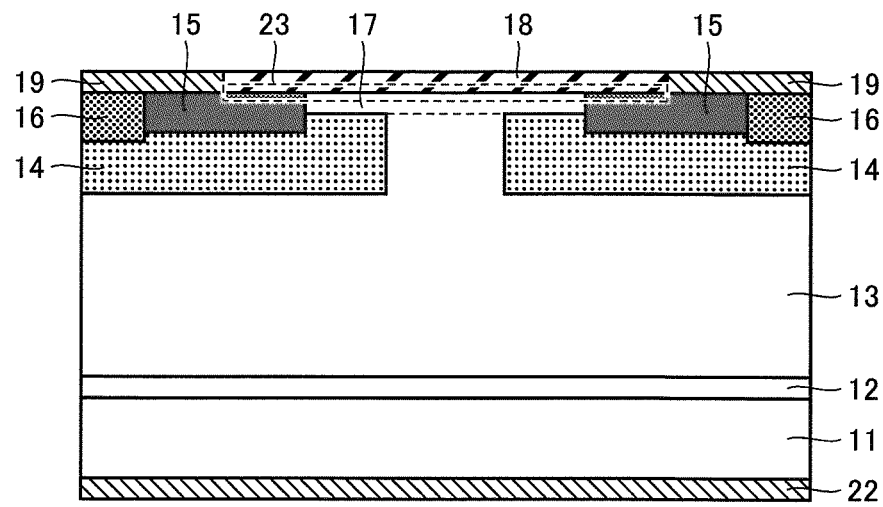
FIG. 8 is a schematic cross sectional view for illustrating the method for manufacturing the MOSFET.

The following describes a method for manufacturing MOSFET 1 in the present embodiment, with reference to FIGS. 2-8. Referring to FIG. 2, a substrate preparing step is performed first as step (S10) in the method for manufacturing MOSFET 1 in the present embodiment. In step (S10), referring to FIG. 3, substrate 11 is prepared. Substrate 11 is formed of, for example, 4H-SiC. Substrate 11 has main surface 11A having an off angle of not less than 50° and not more than 65° relative to the plane orientation of {0001}, for example, having the plane orientation of (03-38). Substrate 11 includes the n type impurity and therefore has n type conductivity. For further improvement of the channel mobility in MOSFET 1 to be manufactured, there may be prepared a substrate 11 having a main surface 11A with a plane orientation of (0-33-8).

Next, referring to FIG. 2, a first epitaxial growth step is performed as step (S20). In this step (S20), referring to FIG. 3, buffer layer 12 and reverse breakdown voltage holding layer 13 are formed, by means of epitaxial growth, on main surface 11A of substrate 11 prepared in step (S10). The epitaxial growth can be implemented by employing, for example, a mixed gas of SiH$_4$ (silane) and C$_3$H$_8$ (propane) as a raw material gas while introducing the n type impurity. On this occasion, first, a SiC layer having an n type impurity introduced at a concentration of approximately $5 \times 10^{17}$ cm$^{-3}$ is formed to have a thickness of approximately 0.5 μm, thereby obtaining buffer layer 12. Then, the concentration of the n type impurity is changed to approximately $5 \times 10^{15}$ cm$^{-3}$ to form a SiC layer having a thickness of approximately 10 μm, thereby obtaining reverse breakdown voltage holding layer 13.

Next, referring to FIG. 2, a well region forming step is performed as step (S30). In this step (S30), referring to FIGS. 3 and 4, the pair of well regions 14 are formed by means of ion implantation in the region including second main surface 13B of reverse breakdown voltage holding layer 13 having been formed in step (S20), i.e., the main surface thereof opposite to its first main surface 13A adjacent to substrate 11.

Specifically, first, on second main surface 13B, an oxide film made of SiO$_2$ is formed by means of, for example, CVD.

Then, a resist is applied to the oxide film, which is then exposed to light and developed, thereby forming a resist film having openings in regions corresponding to desired shapes of well regions 14. Then, using the resist film as a mask, the oxide film is partially removed by means of, for example, ME (Reactive Ion Etching), thereby forming a mask layer constituted by the oxide film having an opening pattern corresponding to the desired shapes of well regions 14. Thereafter, the resist film is removed, and then the p type impurity is ion-implanted using the mask layer as a mask, thus forming well regions 14.

Then, referring to FIG. 2, a first activation annealing step is performed as step (S40). In this step (S40), referring to FIG. 4, reverse breakdown voltage holding layer 13 having been through the ion implantation in step (S30) is heated to perform activation annealing, which is heat treatment for activating the impurity introduced by the ion implantation. The activation annealing is performed by, for example, performing heat treatment in an argon gas atmosphere while keeping a temperature at 1700° C. for 30 minutes.

Next, referring to FIG. 2, a second epitaxial growth step is performed as step (S50). In this step (S50), referring to FIGS. 4 and 5, on second main surface 13B of reverse breakdown voltage holding layer 13, an n type SiC layer 17A to be channel region 17 (see FIG. 1) is formed by means of epitaxial growth. The epitaxial growth can be implemented by introducing the n type impurity using a raw material gas similar to that in step (S20), for example.

Next, as steps (S60) and (S70), an n type contact region forming step and a p type contact region forming step are performed. Specifically, referring to FIGS. 5 and 6, first, in step (S60), a mask layer having an opening pattern corresponding to desired shapes of n type contact regions 15 is formed and then the n type impurity is ion-implanted to form n type contact regions 15, in a procedure similar to that in step (S30). Then, in step (S70), the mask layer is removed and then a mask layer having an opening pattern corresponding to desired shapes of p type contact regions 16 is formed and then the p type impurity is ion-implanted to form p type contact regions 16, in a similar procedure. Remaining n type SiC layer 17A having not been subjected to the ion implantation on this occasion, i.e., n type SiC layer 17A located in the region interposed between the pair of n type contact regions 15 will serve as channel region 17.

Next, referring to FIG. 2, a second activation annealing step is performed as step (S80). In this step (S80), referring to FIG. 6, reverse breakdown voltage holding layer 13 having been through the ion implantations in steps (S60) and (S70) is heated for activation annealing. The activation annealing can be implemented in a manner similar to that in step (S40), for example.

Next, referring to FIG. 2, a gate oxide film forming step is performed as step (S90). In this step (S90), referring to FIGS. 6 and 7, substrate 11 on which reverse breakdown voltage holding layer 13 including the desired ion-implanted layers as well as channel region 17 are formed as a result of steps (S10)-(S80) is heated at 1200° C. in an oxidizing atmosphere for 30 minutes for dry oxidation. Accordingly, a thermal oxidation film 18A to be gate oxide film 18 (see FIG. 1) is formed to extend on channel region 17, n type contact regions 15, and p type contact regions 16. Thermal oxidation film 18A has a thickness of, for example, approximately 40 nm.

Next, referring to FIG. 2, a high-concentration nitrogen region forming step is performed as step (S100). In this step (S100), referring to FIG. 7, heat treatment is performed to heat in, for example, a nitrogen monoxide (NO) gas atmosphere while keeping a temperature at 1200° C. for 120 minutes. In this way, in a region including an interface between thermal oxidation film 18A and each of channel region 17, n type contact regions 15, and p type contact regions 16, there is formed high-concentration nitrogen region 23 having a higher nitrogen concentration than those in the adjacent regions.

Next, referring to FIG. 2, an inert gas annealing step is performed as step (S110). In this step (S110), heat treatment is performed to heat in an inert gas atmosphere such as Ar (argon) while keeping a temperature at 1200° C. for 60 minutes.

Then, as step (S120), an ohmic electrode forming step is performed. In this step (S120), referring to FIGS. 7 and 8, first, a photolithography method is employed to form, on thermal oxidation film 18A, a resist film having openings corresponding to desired shapes of ohmic contact electrodes 19. Next, the resist film is used as a mask in removing thermal oxidation film 18A exposed from the openings and thermal oxidation film 18A formed on the opposite main surface of substrate 11 to the main surface thereof on which reverse breakdown voltage holding layer 13 is formed. Further, for example, without removing the resist film, a nickel (Ni) film is formed by means of vapor deposition on or above thermal oxidation film 18A, n type contact regions 15 and p type contact regions 16 exposed from thermal oxidation film 18A, and the opposite main surface of substrate 11 to the main surface thereof on which reverse breakdown voltage holding layer 13 is formed. Then, the resist film is removed together with the Ni film existing on the resist film (lifted off), thereby forming the Ni film in the regions in which ohmic contact electrodes 19 and drain electrode 22 should be formed. Thereafter, for example, heat treatment is performed to heat in an Ar atmosphere at 950° C. for 2 minutes, which results in silicidation of at least a portion of the Ni film. In this way, ohmic contact electrodes 19 and drain electrode 22 are completed. It should be noted that thermal oxidation film 18A remaining on channel region 17 and n type contact regions 15 on this occasion will serve as gate oxide film 18.

Then, referring to FIG. 2, an electrode forming step is performed as step (S130). In this step (S130), referring to FIGS. 8 and 1, gate electrode 20 made of a conductor such as Al or polysilicon is formed on gate oxide film 18, and source electrodes 21 each made of Al, which is a conductor, are formed on ohmic contact electrodes 19. With the above-described steps, MOSFET 1 in the present embodiment is completed.

EXAMPLES

Example 1

The following describes an Example 1 of the present invention. An experiment was conducted to confirm the improvement of the channel mobility and the reduction of the on resistance in the MOSFET of the present invention. The experiment was conducted in the following procedure.

First, an experiment method will be described. A MOSFET was actually fabricated using the manufacturing method described in the above-described embodiment and the on resistance thereof was measured. Specifically, referring to FIGS. 1-8, first, substrate 11 (n type; resistivity of 0.02 Ωcm) was prepared which was formed of 4H-SiC and had main surface 11A with the plane orientation of (03-38). On the substrate, buffer layer 12 (n type; impurity concentration of $5 \times 10^{17}$ cm$^{-3}$; thickness of 0.5 μm) and reverse breakdown voltage holding layer 13 (n type; impurity concentration of $5 \times 10^{15}$ cm$^{-3}$; thickness of 10 μm) were epitaxially grown.

Thereafter, well regions 14 were formed through ion implantation, and then activation annealing was implemented in an Ar atmosphere while keeping a temperature at 1700° C. for 30 minutes.

Thereafter, n type SiC layer 17A was epitaxially grown, and then n type contact regions 15 and p type contact regions 16 were formed through ion implantation. Thereafter, activation annealing was implemented in Ar atmosphere while keeping a temperature at 1700° C. for 30 minutes.

Next, dry oxidation was implemented in an oxidizing atmosphere while keeping a temperature at 1200° C. for 30 minutes, thereby forming thermal oxidation film 18A having a thickness of 40 nm and to serve as gate oxide film 18. Thereafter, high-concentration nitrogen region 23 was formed in a NO gas atmosphere while keeping a temperature at 1200° C. for 120 minutes. Then, in an Ar gas atmosphere, heat treatment was performed while keeping a temperature at 1200° C. for 60 minutes, and thereafter, ohmic contact electrodes 19, drain electrode 22, gate electrode 20, and source electrodes 21 were formed, thus completing MOSFET 1 (example). Here, a cell pitch was set at 20 μm and a channel length was set at 2 μm. The cell pitch refers to the width of substrate 11 in a direction along main surface 11A in FIG. 1. The channel length refers to the length of channel region 17 along gate oxide film 18 in a region sandwiched between gate oxide film 18 and well region 14 in FIG. 1.

Meanwhile, for the purpose of comparison, a substrate 11 (n type; resistivity of 0.02 Ωcm) was prepared which was formed of 4H-SiC and had a main surface 11A having an off angle of 8° relative to the plane orientation of (0001). Under the same conditions as those in the above-described fabrication method, another MOSFET 1 was fabricated (comparative example).

Then, the MOSFETs of the example and the comparative example were actually operated and respective on resistances were measured with the gate voltage being 15V.

Figure 9:
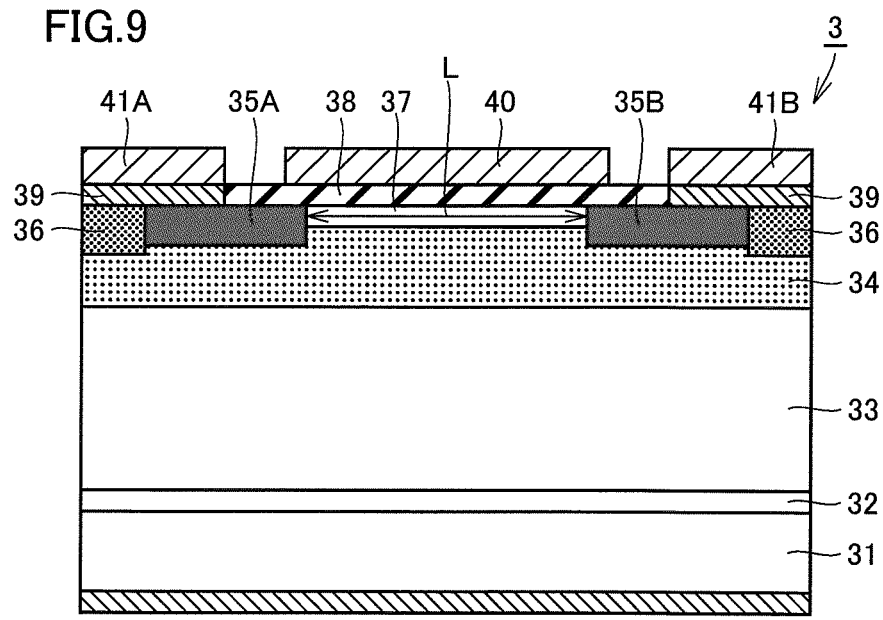
FIG. 9 is a schematic cross sectional view showing a structure of a TEG-MOSFET.

Meanwhile, TEG (Test Element Group)-MOSFETs thereof were fabricated for measurement of channel mobilities. Specifically, referring to FIG. 9, substrates 31 were prepared which were respectively similar to the substrate which had the plane orientation of (03-38) and the substrate which had the off angle of 8° relative to the plane orientation of (0001), both the substrates being used for the fabrication of the MOSFETs for the measurement of on resistances. With them, accumulation type TEG-MOSFETs 3 were fabricated to have the same impurity concentrations, thicknesses, and the like therein as the foregoing MOSFETs, at the same time as the fabrication of the foregoing MOSFETs. Namely, a buffer layer 32 corresponding to buffer layer 12 and an n type layer 33 corresponding to reverse breakdown voltage holding layer 13 were epitaxially grown on each of substrates 31, and then p type layers 34 corresponding to well regions 14 were formed in a similar manner. Buffer layer 32, n type layer 33, and p type layers 34 are the same in impurity concentrations, thicknesses, and the like as those in the foregoing MOSFETs.

Then, an n type SiC layer was formed on p type layer 34, and then ion implantation is performed to form a source region 35A and a drain region 35B corresponding to n type contact regions 15, p type contact regions 36 corresponding to p type contact regions 16, and a channel region 37 corresponding to channel region 17. Further, there were formed a gate oxide film 38 corresponding to gate oxide film 18, ohmic contact electrodes 39 corresponding to ohmic contact electrodes 19, a gate electrode 40 corresponding to gate electrode 20, and a source electrode 41A and a drain electrode 41B corresponding to source electrodes 21 (an accumulation type MOSFET on (03-38) and an accumulation type MOSFET on (0001)). Here, referring to FIG. 9, a channel length L was set at 100 μm, and a channel width (the channel's width in a direction perpendicular to the plane of sheet in FIG. 9) was set at 150 μm.

Further, for the purpose of comparison, substrates 31 were prepared which were similar to substrate 31 having the plane orientation of (03-38) and substrate 31 having the off angle of 8° relative to the plane orientation of (0001). With them, inversion type TEG-MOSFETs were also fabricated. Specifically, in each of the TEG-MOSFETs fabricated, the region corresponding to channel region 37 was omitted and was filled with p type layer 34 in the TEG-MOSFET of FIG. 9 (an inversion type MOSFET on (03-38) and an inversion type MOSFET on (0001)).

Then, the above-described four types of TEG-MOSFETs were operated to inspect a relation between the gate voltage and the channel mobility.

Figure 10:
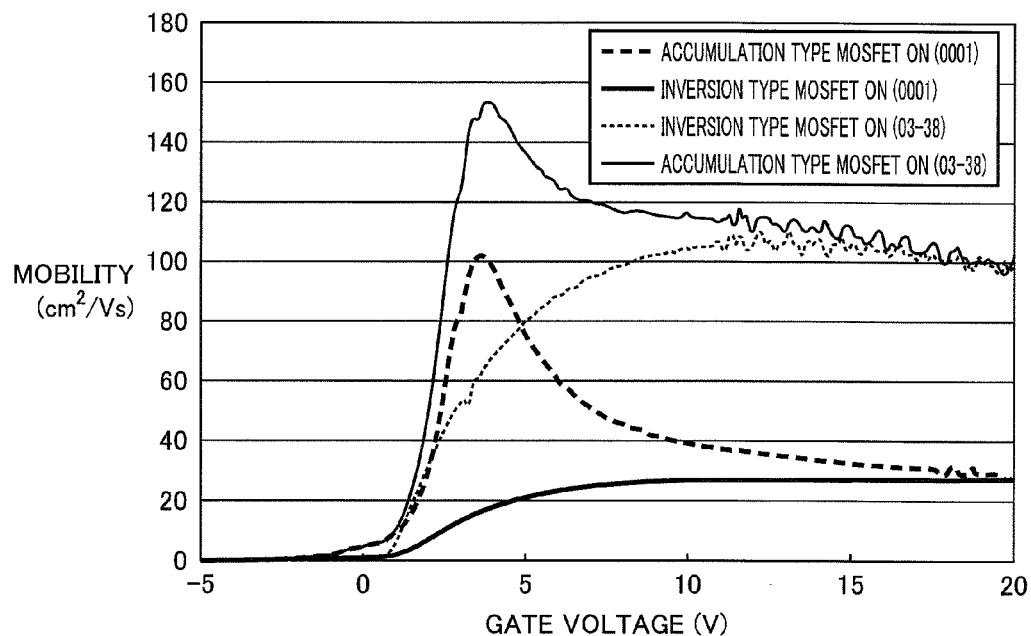
FIG. 10 shows a relation between a gate voltage and a channel mobility.

Now, the results of experiment will be described. Table 1 shows the results of measurement of the on resistances. Further, FIG. 10 shows the relation between the gate voltage and the channel mobility. In FIG. 10, the horizontal axis represents the gate voltage and the vertical axis represents the channel mobility. In FIG. 10, the thick broken line represents the result of measurement for the accumulation type MOSFET employing the substrate of 8° off relative to the (0001) plane. The thick solid line represents the result of measurement for the inversion type MOSFET employing the substrate of 8° off relative to the (0001) plane. The thin broken line represents the result of measurement for the inversion type MOSFET employing the substrate with the (03-38) plane. All of them are the comparative examples falling out of the scope of the present invention. Meanwhile, the thin solid line represents the accumulation type MOSFET (the example of the present invention) employing the substrate with the (03-38) plane. In addition, respective reverse breakdown voltages of the MOSFETs of the example and the comparative examples used for the measurement of the on resistances were measured. It was confirmed that each of the MOSFETs had a sufficient reverse breakdown voltage of 1.2 kV or greater.

Referring to FIG. 10, the MOSFETs employing the same substrate are now compared. The accumulation type MOSFETs were larger in rising of the channel mobility than in the inversion type MOSFETs when increasing the gate voltage. Hence, it is confirmed that the accumulation type MOSFETs are excellent in channel mobility under a low gate voltage. Meanwhile, the accumulation type MOSFETs are compared. For example, when the gate voltage was 20V, the channel mobility was approximately 30 cm$^2$/Vs in the accumulation type MOSFET in the comparative example, i.e., the MOSFET employing the substrate of 8° off relative to the (0001) plane. On the other hand, the channel mobility was approximately 100 cm$^2$/Vs in the accumulation type MOSFET in the example of the present invention, i.e., the MOSFET employing the substrate with the (03-38) plane. Presumably, this is due to the following reason. That is, the utilization of the substrate with the (03-38) plane in the MOSFET of the example contributed to reduction of interface states in the vicinity of the interface between the channel region and the gate oxide film.

TABLE 1

| Substrate | | On Resistance (mΩcm$^2$) |
|---|---|---|
| Comparative Example | 4H—SiC (0001) Substrate with 8° Off | 5 |
| Example | 4H—SiC (03-38) Substrate | 2 |

Further, referring to Table 1, the accumulation type MOSFET employing the substrate with the (03-38) plane in the example of the present invention had an on resistance restrained to 40% of that of the accumulation type MOSFET employing the substrate having the off angle of 8° relative to the (0001) plane in the comparative example.

From the results of experiment, it was confirmed that according to the MOSFET of the present invention, there can be provided a MOSFET allowing for reduced on resistance by improving channel mobility even when the gate voltage is high.

Example 2

The following describes an Example 2 of the present invention. An experiment was conducted to inspect a relation between the channel mobility of the inversion type MOSFET and the maximum value (peak nitrogen concentration) of the nitrogen concentration in a region distant away by 10 nm or shorter from the interface between the channel region and the oxide film. The experiment was conducted in the following procedure.

Figure 11:
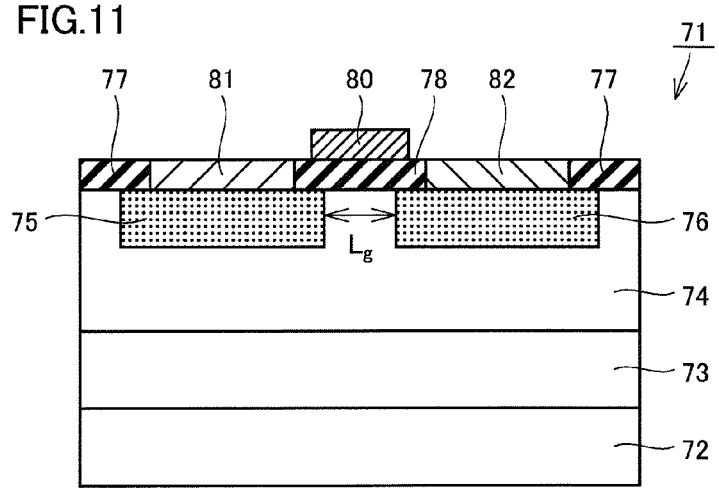
FIG. 11 is a schematic cross sectional view showing a structure of an inversion type MOSFET used as a sample in experiment.

First, as each of samples, an inversion type MOSFET 71 of lateral type was fabricated as shown in FIG. 11. More specifically, on an n type silicon carbide substrate 72 having a thickness of 400 μm, an epitaxial layer 73 having a thickness of 10 μm was formed. Then, on epitaxial layer 73, a p type layer 74 having a thickness of 1 μm was formed. Then, into p type layer 74, phosphorus (P) was implanted as an n type impurity to form n$^+$ regions 75, 76 each having an n type impurity concentration of $1\times10^{20}$ cm$^3$. A distance between n$^+$ regions 75, 76 corresponded to the gate length (channel length $L_g$), which was set at 100 μm. Further, the gate width (channel width) was set at 200 μm.

Then, dry oxidation treatment was provided to form an oxide film and thereafter nitrogen annealing was performed by heating in a NO gas atmosphere. In doing so, an amount of nitrogen introduced was changed by changing heating time. Thereafter, the oxide film was etched to form into shapes corresponding to oxide films 77, 78, and there were formed a source electrode 81, a drain electrode 82, and a gate electrode 80 on oxide film 78 serving as the gate oxide film. Each of source electrode 81 and drain electrode 82 was made of nickel (Ni), and had a thickness of 0.1 μm. Further, gate electrode 80 was made of aluminum (Al), and had a thickness of 1 μm. With the above-described procedure, inversion type MOSFET 71 of the lateral type was completed as a sample. In addition, for the purpose of comparison, another sample was fabricated with the nitrogen annealing not being performed in the procedure.

The following describes a method for measuring the channel mobility. With a source-drain voltage $V_{DS}$=0.1 V, a gate voltage $V_G$ was applied and source-drain current $I_{DS}$ was measured (gate voltage dependency was measured). Then, with $g_m=(\delta I_{DS})/(\delta V_G)$, the maximum value of the channel mobility relative to the gate voltage was determined from the following formula:

$$\text{channel mobility } \mu = g_m \times (L \times d)/(W \times \epsilon \times V_{DS}),$$

where L indicates the gate length, d indicates the thickness of the oxide film, W indicates the gate width, and ϵ indicates the permittivity of the oxide film.

Further, for each of the samples, distribution of the nitrogen concentration was measured in a depth direction in the vicinity of the interface between oxide film 78 and p type layer 74 (region distant away by 10 nm or shorter from the interface). The measurement was performed using a SIMS (secondary ion mass spectrometry).

Figure 12:
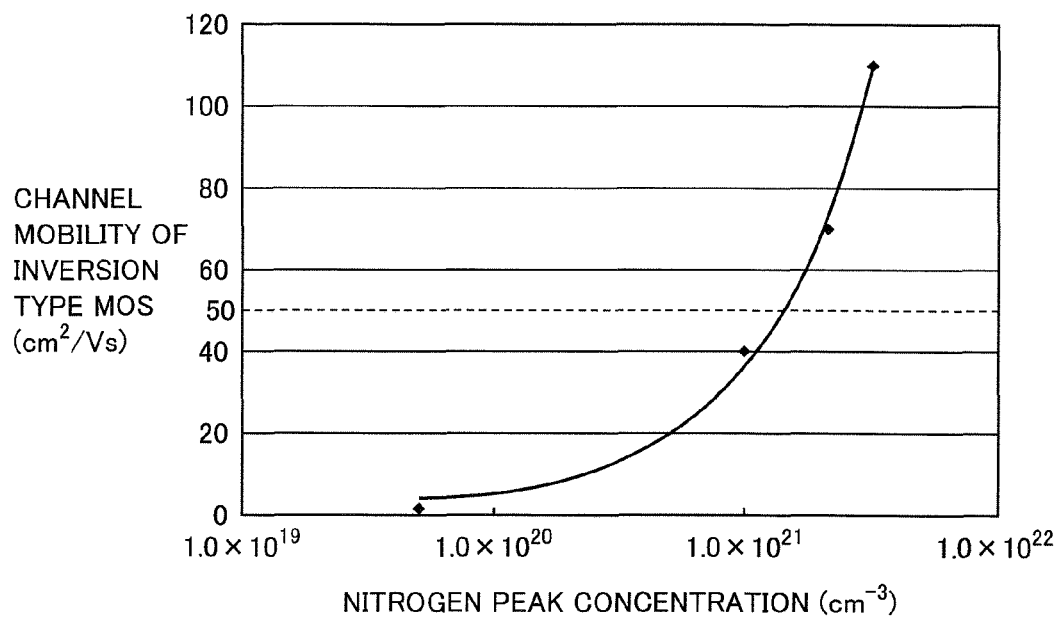
FIG. 12 shows a relation between a nitrogen peak concentration and an inversion type MOS channel mobility.

The following describes the results of measurement with reference to FIG. 12. In FIG. 12, the horizontal axis represents the peak value of nitrogen concentration (peak nitrogen concentration) measured in each of the samples. The vertical axis represents the measured channel mobility of each of the inversion type MOSFETs.

Referring to FIG. 12, as the peak nitrogen concentration became higher in the region distant away by 10 nm or shorter from the interface between oxide film 78 and p type layer 74, the channel mobility became higher.

Here, the channel mobility is preferably 50 cm$^2$/Vs or greater to reduce the on resistance by an amount greater than that in the conventional MOSFET employing silicon as its raw material. Referring to FIG. 12, in order to obtain the channel mobility of 50 cm$^2$/Vs or greater in inversion type MOSFET, it is preferable to set the peak nitrogen concentration at $1\times10^{21}$ cm$^{-3}$ or greater in consideration of fluctuations in manufacturing processes. By improving the channel mobility of the inversion type MOSFET in the above-described manner, the channel mobility of the accumulation type MOSFET under high gate voltage can be sufficiently improved. Hence, in order to sufficiently improve the channel mobility in the accumulation type MOSFET under a high gate voltage, it can be said that the maximum value of the nitrogen concentration is preferably set at $1\times10^{21}$ cm$^{-3}$ or greater in the region distant away by 10 nm or shorter from the interface between the channel region and the oxide film.

Example 3

The following describes an Example 3 of the present invention. An experiment was conducted to inspect a relation between the off angle of the substrate and the channel mobility of the inversion type MOSFET. The experiment was conducted in the following procedure.

First, samples were fabricated using the same manufacturing method as the method for manufacturing the sample having the highest channel mobility in Example 2 described above. Specifically, substrates having main surfaces different in plane orientations were used to fabricate four types of samples as comparative examples and three types of samples as examples of the present invention. More specifically, as a comparative example A, a sample was prepared which used a silicon carbide substrate having a main surface with an off angle of 8° relative to the plane orientation of (0001) (substrate of 8° off relative to (0001)). As a comparative example B, a sample was prepared which used a substrate having a main surface with a plane orientation expressed by (01-15). As a comparative example C, a sample was prepared which used a substrate having a main surface with a plane orientation expressed by (01-14). As a comparative example D, a sample was prepared which used a substrate having a main surface with an off angle of 70° relative to the plane orientation of (0001). Meanwhile, the examples of the present invention were as follows. As an example A, a sample was prepared which used a substrate having a main surface with a plane orientation expressed by (01-13). As an example B, a sample was prepared which used a substrate having a main surface with a plane orientation expressed by (03-38). As an example C, a sample was prepared which used a substrate having a main surface with a plane orientation expressed by (01-12).

Then, channel mobility in each of the samples described above was measured. A method employed to measure the channel mobility was the same method as the method for measuring the channel mobility in Example 2 described above.

Figure 13:
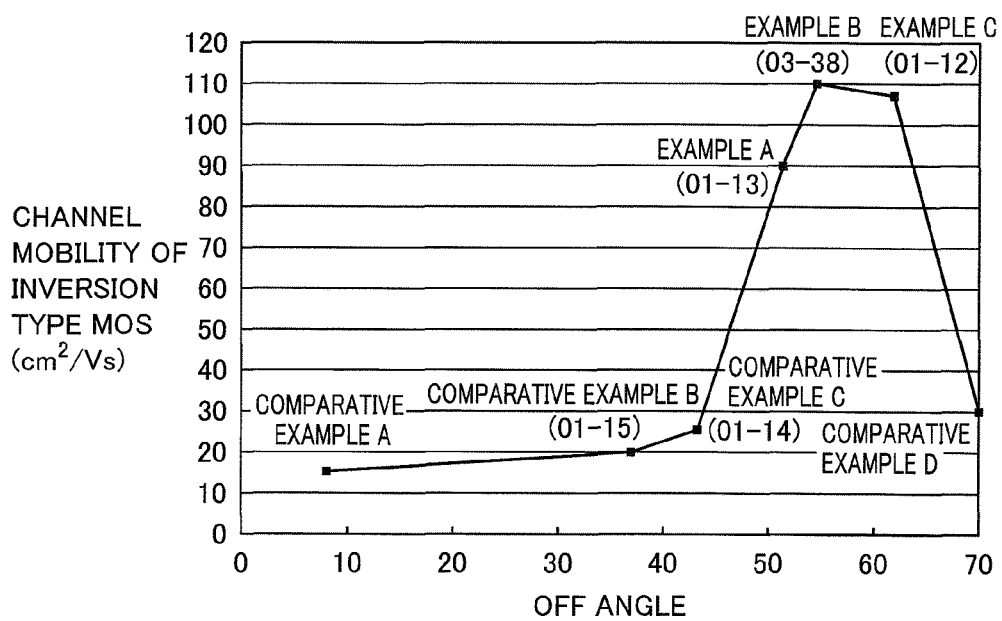
FIG. 13 shows a relation between an off angle of the main surface of the substrate relative to the plane orientation of {0001} and the inversion type MOS channel mobility.

The following describes the results of experiment with reference to FIG. 13. Here, in FIG. 13, the horizontal axis represents the off angle of the main surface of the substrate of each sample relative to the plane orientation of {0001}. The vertical axis represents the channel mobility of each of the inversion type MOSFETs.

Referring to FIG. 13, regarding the samples of examples A-C with the off angles falling within the range corresponding to that of the examples of the present invention (not less than 50° and not more than 65°), it is appreciated that the values of channel mobilities were significantly improved in the inversion type MOSFETs as compared with those in the comparative examples.

Here, by improving the channel mobility of each of the inversion type MOSFETs in the above-described manner, the channel mobility of the accumulation type MOSFET under high gate voltage can be sufficiently improved. Hence, in order to sufficiently improve the channel mobility under high gate voltage in the accumulation type MOSFET, it is effective to employ a substrate having a main surface with an off angle of not less than 50° and not more than 65° relative to the plane orientation of {0001}.

In the above-described examples, it has been described that the carrier mobility (channel mobility) is improved by adopting a main surface close to the (03-38) plane, as a result of the conducted experiment that utilizes the structure provided with the semiconductor layers and the insulating film formed on and above the main surface of the silicon plane side. Meanwhile, the inventor also has conducted an experiment using a structure provided with semiconductor layers and an insulating film formed on and above the main surface of the carbon plane side. The inventor has found that the carrier mobility (channel mobility) is further improved by adopting a main surface close to the (0-33-8) plane.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

INDUSTRIAL APPLICABILITY

An insulated gate field effect transistor of the present invention can be advantageously applied to, in particular, an insulated gate field effect transistor required to achieve reduced on resistance.

DESCRIPTION OF THE REFERENCE SIGNS

1: MOSFET; 3: TEG-MOSFET; 11: substrate; 11A: main surface; 12: buffer layer; 13: reverse breakdown voltage holding layer; 13A: first main surface; 13B: second main surface; 14: well region; 15: n type contact region; 16: p type contact region; 17: channel region; 17A: n type SiC layer; 18: gate oxide film; 18A: thermal oxidation film; 19: ohmic contact electrode; 20: gate electrode; 21: source electrode; 22: drain electrode; 23: high-concentration nitrogen region; 31: substrate; 32: buffer layer; 33: n type layer; 34: p type layer; 35A: source region; 35B: drain region; 36: p type contact region; 37: channel region; 38: gate oxide film; 39: ohmic contact electrode; 40: gate electrode; 41A: source electrode; 41B: drain electrode; 71: inversion type MOSFET; 72: n type silicon carbide substrate; 73: epitaxial layer; 74: p type layer; 75, 76: $n^+$ region; 77, 78: oxide film; 80: gate electrode; 81: source electrode; 82: drain electrode.

The invention claimed is:
1. An insulated gate field effect transistor, comprising:
a substrate of first conductive type, said substrate being made of silicon carbide and having a main surface with an off angle of not less than 50° and not more than 65° relative to a {0001} plane;
a reverse breakdown voltage holding layer of said first conductive type, said reverse breakdown voltage holding layer being made of silicon carbide and being formed on said main surface of said substrate;
a well region of second conductive type different from said first conductive type, said well region being formed in said reverse breakdown voltage holding layer distant away from a first main surface thereof, said first main surface being a main surface adjacent to said substrate;
an oxide film formed on said well region and made of oxide;
a first conductive type contact region disposed between said well region and said oxide film and including an impurity of said first conductive type at a concentration higher than that of said reverse breakdown voltage holding layer;
a channel region disposed between said well region and said oxide film in contact with said well region and said oxide film, connecting said first conductive type contact region and said reverse breakdown voltage holding layer to each other, and being of said first conductive type by including an impurity of said first conductive type at a concentration lower than that of said first conductive type contact region; and
an electrode disposed on said oxide film,
in a region including an interface between said channel region and said oxide film, a high-concentration nitrogen region being formed to have a nitrogen concentration higher than those of said channel region and said oxide film,
wherein a nitrogen concentration in a region distant away by 10 nm or shorter from said interface between said channel region and said oxide film has a maximum value of not less than $1 \times 10^{21}$ cm$^{-3}$.
2. The insulated gate field effect transistor according to claim 1, wherein said main surface of said substrate has an off orientation falling within a range of ±5° or smaller relative to a <11-20> direction.
3. The insulated gate field effect transistor according to claim 1, wherein said main surface of said substrate has an off orientation falling within a range of ±5° or smaller relative to a <01-10> direction.
4. The insulated gate field effect transistor according to claim 3, wherein said main surface of said substrate has a plane orientation with an off angle of not less than −3° and not more than +5° relative to a plane orientation {03-38}.
5. The insulated gate field effect transistor according to claim 3, wherein said main surface of said substrate has an off angle of not less than −3° and not more than +5° relative to a (0-33-8) plane in the <01-10> direction.

* * * * *